(12) United States Patent
Byers et al.

(10) Patent No.: US 10,846,444 B2
(45) Date of Patent: Nov. 24, 2020

(54) SYSTEMS AND METHODS FOR GENERATING COMPUTER-AIDED DESIGN MODEL VIEWS BASED ON PRODUCT AND MANUFACTURING INFORMATION DATA

(71) Applicant: General Electric Company, Schenectady, NY (US)

(72) Inventors: Jason Anton Byers, Greenville, SC (US); Alexandria Stoker Cochrane, Greenville, SC (US); Brian Christopher Wheeler, Simpsonville, SC (US); Kena Kimi Yokoyama, Simpsonville, SC (US); Jeffrey David Erno, Simpsonville, SC (US)

(73) Assignee: General Electric Company, Schenectady, NY (US)

( * ) Notice: Subject to any disclaimer, the term of this patent is extended or adjusted under 35 U.S.C. 154(b) by 180 days.

(21) Appl. No.: 15/582,538

(22) Filed: Apr. 28, 2017

(65) Prior Publication Data

US 2018/0315237 A1    Nov. 1, 2018

(51) Int. Cl.
*G06F 30/20*      (2020.01)
*G06T 19/00*      (2011.01)

(52) U.S. Cl.
CPC .............. *G06F 30/20* (2020.01); *G06T 19/00* (2013.01); *G06T 2200/24* (2013.01); *G06T 2219/004* (2013.01)

(58) Field of Classification Search
CPC . G06F 17/5009; G06T 19/00; G06T 2200/24; G06T 2219/004
See application file for complete search history.

(56) References Cited

U.S. PATENT DOCUMENTS

| | | | |
|---|---|---|---|
| 5,214,753 A * | 5/1993 | Lee | G06F 17/17 345/610 |
| 5,297,241 A | 3/1994 | Hirr, Jr. et al. | |
| 2002/0118187 A1* | 8/2002 | Batori | G06T 19/00 345/419 |
| 2002/0118229 A1* | 8/2002 | Batori | G06F 30/17 715/771 |
| 2002/0175948 A1* | 11/2002 | Nielsen | G06F 3/033 715/781 |
| 2003/0128206 A1 | 7/2003 | Sinn | |
| 2005/0093860 A1* | 5/2005 | Yanagisawa | G06T 19/00 345/419 |
| 2005/0108215 A1 | 5/2005 | Thomas et al. | |
| 2005/0204277 A1 | 9/2005 | Garcia et al. | |
| 2008/0269942 A1* | 10/2008 | Free | G06F 17/50 700/182 |
| 2011/0098983 A1* | 4/2011 | Staples | G06F 17/50 703/1 |

(Continued)

*Primary Examiner* — King Y Poon
*Assistant Examiner* — Vincent Peren
(74) *Attorney, Agent, or Firm* — Fletcher Yoder, P.C.

(57) ABSTRACT

A method includes receiving, via a processor, a three-dimensional (3D) computer-aided design (CAD) data associated with a 3D CAD model, receiving, via the processor, a product and manufacturing information (PMI) data associated with the 3D CAD data, and receiving, via the processor, user input. The method also includes deriving, via the processor, a view of the 3D CAD data based on the received PMI data and the received user input.

20 Claims, 6 Drawing Sheets

(56) References Cited

U.S. PATENT DOCUMENTS

| | | | |
|---|---|---|---|
| 2014/0210824 A1* | 7/2014 | Hadley | G06F 17/30011 345/427 |
| 2015/0112468 A1* | 4/2015 | Rudnick, III | G05B 19/41865 700/98 |
| 2016/0055665 A1* | 2/2016 | Floyd | G09G 5/02 345/419 |
| 2017/0116352 A1* | 4/2017 | Kohlhoff | G06F 17/50 |
| 2017/0148227 A1* | 5/2017 | Alsaffar | G06T 11/20 |

* cited by examiner

SYSTEMS AND METHODS FOR GENERATING COMPUTER-AIDED DESIGN MODEL VIEWS BASED ON PRODUCT AND MANUFACTURING INFORMATION DATA

BACKGROUND OF THE INVENTION

The subject matter disclosed herein relates to systems and methods for generating views of models such as computer-aided design models that may be used in the design and inspection of parts, such as industrial machine parts.

Industrial machines, such as gas turbine systems, may provide for the generation of power. For example, the gas turbine systems typically include a compressor for compressing a working fluid, such as air, a combustor for combusting the compressed working fluid with fuel, and a turbine for turning the combusted fluid into a rotative power. For example, the compressed air is injected into a combustor, which heats the fluid causing it to expand, and the expanded fluid is forced through the gas turbine. The gas turbine may then convert the expanded fluid into rotative power, for example, by a series of blade stages. The rotative power may then be used to drive a load, which may include an electrical generator producing electrical power and electrically coupled to a power distribution grid. Industrial machines and machine parts may be designed for a particular purpose, such as a compressor blade designed to compress air. The machine or part may then be inspected for its ability to fulfill its design purpose.

BRIEF DESCRIPTION OF THE INVENTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In a first embodiment, a method includes receiving, via a processor, a three-dimensional (3D) computer-aided design (CAD) data associated with a 3D CAD model, receiving, via the processor, a product and manufacturing information (PMI) data associated with the 3D CAD data, and receiving, via the processor, user input. The method also includes deriving, via the processor, a view of the 3D CAD data based on the received PMI data and the received user input.

In another embodiment, a computer aided technologies (CAx) system, includes a processor that is configured to receive a three-dimensional (3D) computer-aided design (CAD) data associated with a 3D CAD model. The processor is also configured to receive a product and manufacturing information (PMI) data associated with the 3D CAD data. Additionally, the processor is configured to receive user input and derive a view of the 3D CAD data based on the received PMI data and the received user input.

In yet another embodiment, a tangible, non-transitory, computer-readable medium comprising instructions that, when executed, are configured to cause a processor to receive a three-dimensional (3D) computer-aided design (CAD) data associated with a 3D CAD model, receive a product and manufacturing information (PMI) data associated with the 3D CAD data, and receive user input. The instructions are also configured to cause the processor to derive a view of the 3D CAD model based on the received PMI data and the received user input;

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Designing a machine or part may include certain systems and methods described in more detail below that produce a part design. For example, the part design may be created as a model-based definition included in a 3-dimensional (3D) computer-aided design (CAD) model. The techniques described herein may not create typical engineering part drawing or drawings, as the CAD model may contain all part dimensional and tolerance information.

During and after the creation of the part design, a user may generate one or more views of a design (e.g., part design) included in a CAD model that may be used for various purposes. For example, the techniques described herein may more easily create multiple views of a part or parts. The views may be used in the design and construction of the part. Additionally, a user may provide input that may be used to generate the views. For instance, a user may select from different types of views, and enter the input to alter certain settings of the views to be generated. As explained in more detail below, the various types of views that may be generated include, but are not limited to, detailed and derived views.

Figure 1:
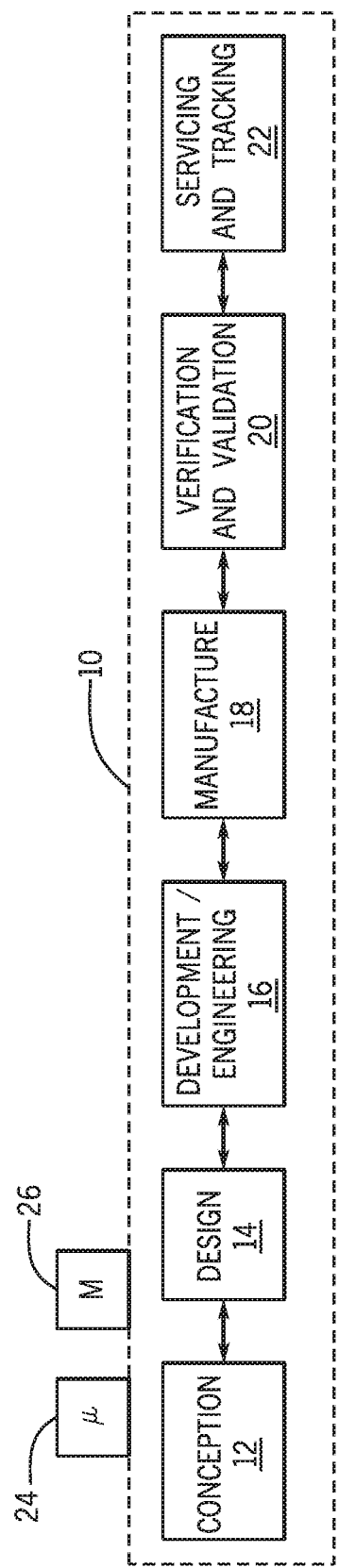
FIG. 1 is a block diagram of an embodiment of a computer-aided technology (CAx) system.

With the foregoing in mind, it may be useful to describe a computer-aided technologies (CAx) system that may incorporate the techniques described herein, for example to improve product lifecycle management (PLM) processes. Accordingly, FIG. 1 illustrates an embodiment of a CAx system 10 suitable for providing for a variety of processes, including PLM processes 12, 14, 16, 18, 20, 22. In the depicted embodiment, the CAx system 10 may include support for execution of conception processes 12. For example, the conception processes 12 may produce a set of specifications such as requirements specifications documenting a set of requirements to be satisfied by a design, a part, a product, or a combination thereof. The conception processes 12 may also produce a concept or prototype for the part or product (e.g., machine). A series of design processes 14 may then use the specifications and/or prototype to produce, for example, one or more 3D design models of the part or product. The 3D design models may include solid/surface modeling, parametric models, wireframe models, vector models, non-uniform rational basis spline (NURBS) models, geometric models, and the like. Additionally, as described below, the 3D design models may include various views.

Design models may then be further refined and added to via the execution of development/engineering processes 16. The development/engineering processes may, for example, create and apply models such as thermodynamic models, low cycle fatigue (LCF) life prediction models, multibody dynamics and kinematics models, computational fluid dynamics (CFD) models, finite element analysis (FEA) models, and/or 3-dimension to 2-dimension FEA mapping models that may be used to predict the behavior of the part or product during its operation. For example, turbine blades may be modeled to predict fluid flows, pressures, clearances, and the like, during operations of a gas turbine engine. The development/engineering processes 16 may additionally result in tolerances, materials specifications (e.g., material type, material hardness), clearance specifications, and the like.

The CAx system 10 may additionally provide for manufacturing processes 18 that may include manufacturing automation support. For example, additive manufacturing models may be derived, such as 3D printing models for material jetting, binder jetting, vat photopolymerization, powder bed fusion, sheet lamination, directed energy deposition, material extrusion, and the like, to create the part or product. Other manufacturing models may be derived, such as computer numeric control (CNC) models with G-code to machine or otherwise remove material to produce the part or product (e.g., via milling, lathing, plasma cutting, wire cutting, and so on). Bill of materials (BOM) creation, requisition orders, purchasing orders, and the like, may also be provided as part of the manufacture processes 18 (or other PLM processes).

The CAx system 10 may additionally provide for verification and/or validation processes 20 that may include automated inspection of the part or product as well as automated comparison of specifications, requirements, and the like. In one example, a coordinate-measuring machine (CMM) process may be used to automate inspection of the part or product.

A servicing and tracking set of processes 22 may also be provided via the CAx system 10. The servicing and tracking processes 22 may log maintenance activities for the part, part replacements, part life (e.g., in fired hours), and so on. As illustrated, the CAx system 10 may include feedback between the processes 12, 14, 16, 18, 20, 22. For example, data from services and tracking processes 22, for example, may be used to redesign the part or product via the design processes 14. Indeed, data from any one of the processes 12, 14, 16, 18, 20, 22 may be used by any other of the processes 12, 14, 16, 18, 20, 22 to improve the part or product or to create a new part or a new product. In this manner, the CAx system 10 may incorporate data from downstream processes and use the data to improve the part or to create a new part.

The CAx system 10 may additionally include one or more processors 24 and a memory system 26 that may execute software programs to perform the disclosed techniques. Moreover, the processors 24 may include multiple microprocessors, one or more "general-purpose" microprocessors, one or more special-purpose microprocessors, and/or one or more application specific integrated circuits (ASICS), or some combination thereof. For example, the processors 24 may include one or more reduced instruction set (RISC) processors. The memory system 26 may store information such as control software, look up tables, configuration data, etc. The memory system 26 may include a tangible, non-transitory, machine-readable medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof).

Figure 2:
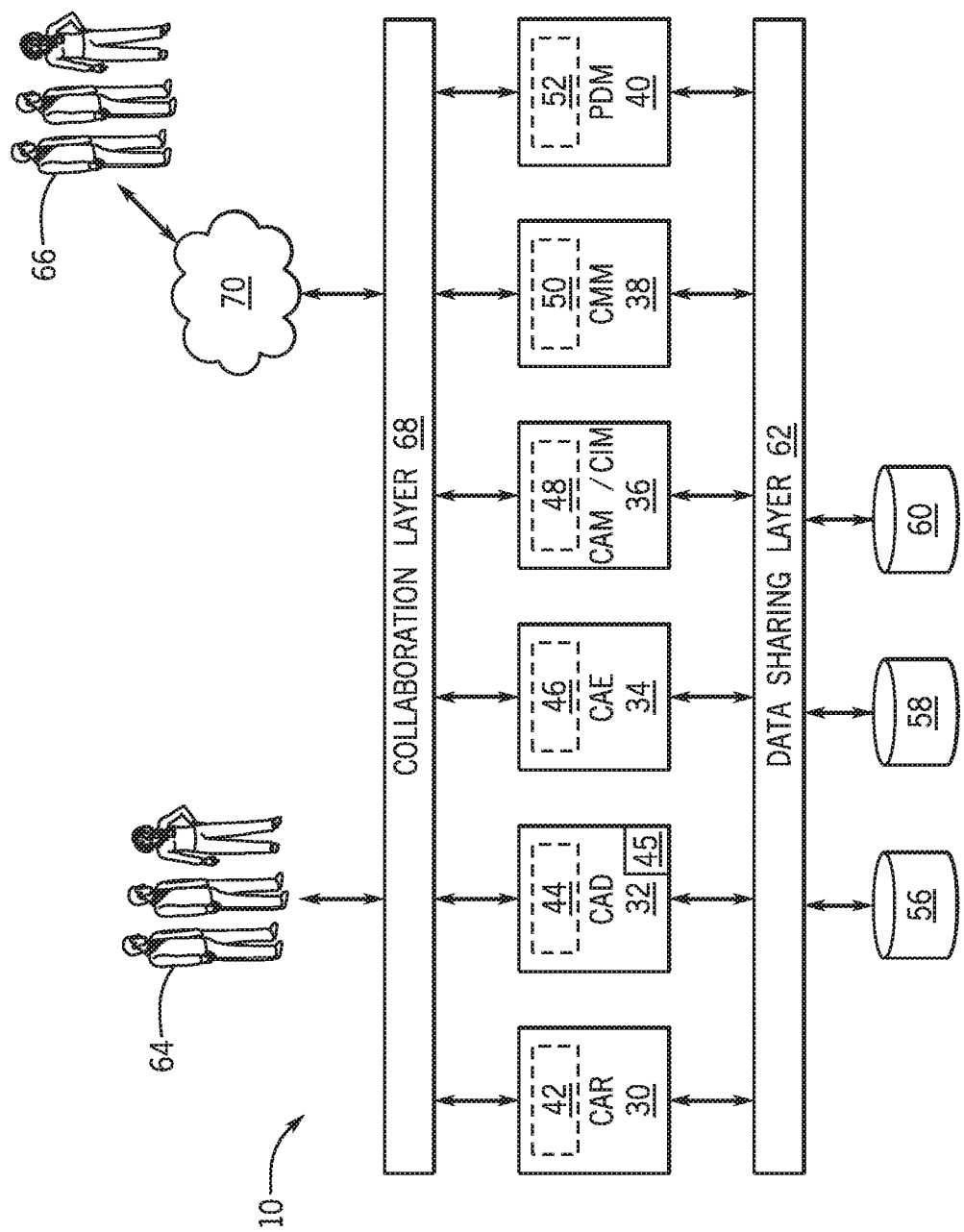
FIG. 2 is a block diagram of embodiments certain components of the CAx system of FIG. 1.

The memory system 26 may store a variety of information, which may be suitable for various purposes. For example, the memory system 26 may store machine-readable and/or processor-executable instructions (e.g., firmware or software) for the processors' 24 execution. In one embodiment, the executable instructions include instructions for a number of PLM systems, for example software systems, as shown in the embodiment of FIG. 2. More specifically, the CAx system 10 embodiment illustrates a computer-aided requirements capture (CAR) system 30, a computer-aided design (CAD) system 32, a computer-aided engineering (CAE) system 34, computer-aided manufacturing/computer-integrated manufacturing (CAM/CIM) system 36, a coordinate-measuring machine (CMM) system 38, and a product data management (PDM) system 40. Each of the systems 30, 32, 34, 36, 38 and 40 may be extensible and/or customizable; accordingly, each system 30 may include an extensibility and customization system 42, 44, 46, 48, 50, and 52, respectively. Additionally, each of the systems 30, 32, 34, 36, 38 and 40 may be stored in a memory system, such as memory system 26, and may be executable via a processor, such as via processors 24.

In the depicted embodiment, the CAR system 30 may provide for entry of requirements and/or specifications, such as dimensions for the part or product, operational conditions that the part or product is expected to encounter (e.g., temperatures, pressures), certifications to be adhered to, quality control requirements, performance requirements, and so on. The CAD system 32 may provide for a graphical user interface suitable to create and manipulate graphical representations of two-dimensional (2D) and/or 3D models as described above with respect to the design processes 14. For example, the 3D design models may include solid/surface modeling, parametric models, wireframe models, vector models, non-uniform rational basis spline (NURBS)

models, geometric models, and the like. The CAD system 32 may provide for the creation and updating of the 2D and/or 3D models and related information (e.g., views, drawings, annotations, notes, and so on). Indeed, the CAD system 32 may combine a graphical representation of the part or product with other, related information. Moreover, as discussed in detail below, the CAD system 32 may provide for the generation of views 45. A user may create and save various views of the 2D and 3D models, and the views 45 may be utilized by the user to view various aspects of the 2D and 3D models. For example, the CAD system 32 may be used by the user to generate views 45 of the 2D and 3D models that emphasize certain features of the models.

The CAE system 34 may enable creation of various engineering models, such as the models described above with respect to the development/engineering processes 16. For example, the CAE system 34 may apply engineering principles to create models such as thermodynamic models, low cycle fatigue (LCF) life prediction models, multibody dynamics and kinematics models, computational fluid dynamics (CFD) models, finite element analysis (FEA) models, and/or 3-dimension to 2-dimension FEA mapping models. The CAE system 34 may then apply the aforementioned models to analyze certain part or product properties (e.g., physical properties, thermodynamic properties, fluid flow properties, and so on), for example, to better match the requirements and specifications for the part or product.

The CAM/CIM system 36 may provide for certain automation and manufacturing efficiencies, for example, by deriving certain programs or code (e.g., G-code) and then executing the programs or code to manufacture the part or product. The CAM/CIM system 36 may support certain automated manufacturing techniques, such as additive (or subtractive) manufacturing techniques, including material jetting, binder jetting, vat photopolymerization, powder bed fusion, sheet lamination, directed energy deposition, material extrusion, milling, lathing, plasma cutting, wire cutting, or a combination thereof. The CMM system 38 may include machinery to automate inspections. For example, probe-based, camera-based, and/or sensor-based machinery may automatically inspect the part or product to ensure compliance with certain design geometries, tolerances, shapes, and so on.

The PDM system 40 may be responsible for the management and publication of data from the systems 30, 32, 34, 36, and/or 38. For example, the systems 30, 32, 34, 36, and/or 38 may communicate with data repositories 56, 58, 60 via a data sharing layer 62. The PDM system 40 may then manage collaboration between the systems 30, 32, 34, 36, and/or 38 by providing for data translation services, versioning support, archive management, notices of updates, and so on. The PDM system 40 may additionally provide for business support such as interfacing with supplier/vendor systems and/or logistics systems for purchasing, invoicing, order tracking, and so on. The PDM system 40 may also interface with service/logging systems (e.g., service center data management systems) to aid in tracking the maintenance and life cycle of the part or product as it undergoes operations. Teams 64, 66 may collaborate with team members via a collaboration layer 68. The collaboration layer 68 may include web interfaces, messaging systems, file drop/pickup systems, and the like, suitable for sharing information and a variety of data. The collaboration layer 68 may also include cloud-based systems 70 or communicate with the cloud-based systems 70 that may provide for decentralized computing services and file storage. For example, portions (or all) of the systems 30, 32, 34, 36, 38 may be stored in the cloud 70 and/or accessible via the cloud 70.

The extensibility and customization systems 42, 44, 46, 48, 50, and 52 may provide for functionality not found natively in the CAR system 30, the CAD system 32, the CAM/CIM system 36, the CMM system 38 and/or the PDM system 40. For example, computer code or instructions may be added to the systems 30, 32, 34, 36, and/or 38 via shared libraries, modules, software subsystems and the like, included in the extensibility and customization systems 42, 44, 46, 48, 50, and/or 52. The extensibility and customization systems 42, 44, 46, 48, 50, and 52 may also use application programming interfaces (APIs) included in their respective systems 30, 32, 34, 36, and 38 to execute certain functions, objects, shared data, software systems, and so on, useful in extending the capabilities of the CAR system 30, the CAD system 32, the CAM/CIM system 36, the CMM system 38 and/or the PDM system 40. By enabling the processes 12, 14, 16, 18, 20, and 22, for example, via the systems 30, 32, 34, 36, and 38 and their respective extensibility and customization systems 42, 44, 46, 48, 50, and 52, the techniques described herein may provide for a more efficient "cradle-to-grave" product lifecycle management.

Figure 3:
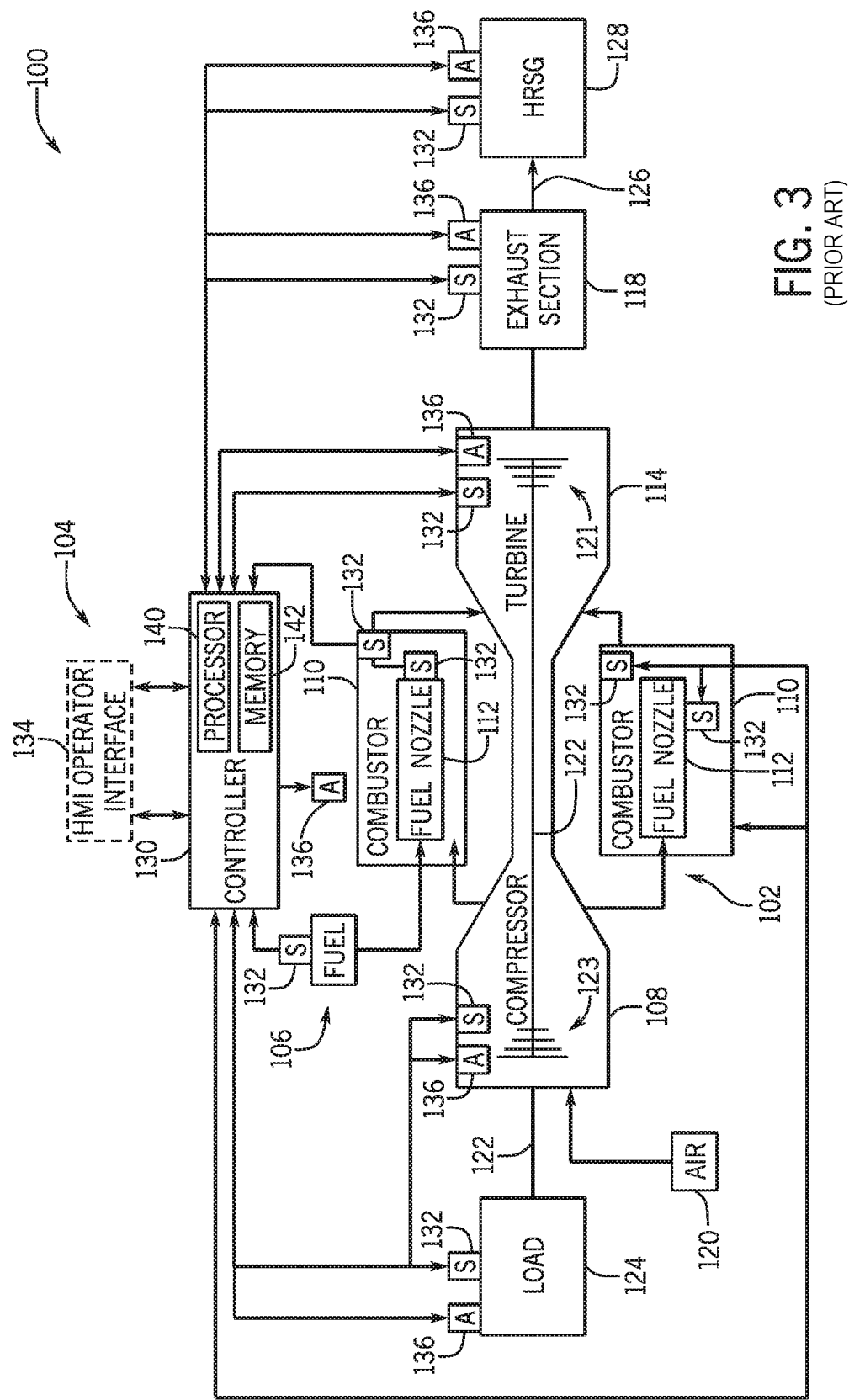
FIG. 3 is a block diagram of an embodiment of an industrial system that may be conceived, designed, engineered, manufactured, and/or service and tracked by the CAx system of FIG. 1.

It may be beneficial to describe a machine that would incorporate one or more parts manufactured and tracked by the processes 12, 14, 16, 18, 20, and 22, for example, via the CAx system 10. Accordingly, FIG. 3 illustrates an example of a power production system 100 that may be entirely (or partially) conceived, designed, engineered, manufactured, serviced, and tracked by the CAx system 10. As illustrated in FIG. 1, the power production system 100 includes a gas turbine system 102, a monitoring and control system 104, and a fuel supply system 106. The gas turbine system 102 may include a compressor 108, combustion systems 110, fuel nozzles 112, a gas turbine 114, and an exhaust section 118. During operation, the gas turbine system 102 may pull air 120 into the compressor 108, which may then compress the air 120 (e.g., via one or more stages of compressor blades 123) and move the air 120 to the combustion system 110 (e.g., which may include a number of combustors). In the combustion system 110, the fuel nozzle 112 (or a number of fuel nozzles 112) may inject fuel that mixes with the compressed air 120 to create, for example, an air-fuel mixture.

The air-fuel mixture may combust in the combustion system 110 to generate hot combustion gases, which flow downstream into the turbine 114 to drive one or more turbine stages. For example, the combustion gases may move through the turbine 114 to drive one or more stages of turbine blades 121, which may in turn drive rotation of a shaft 122. The shaft 122 may connect to a load 124, such as a generator that uses the torque of the shaft 122 to produce electricity. After passing through the turbine 114, the hot combustion gases may vent as exhaust gases 126 into the environment by way of the exhaust section 118. The exhaust gas 126 may include gases such as carbon dioxide ($CO_2$), carbon monoxide (CO), nitrogen oxides ($NO_x$), and so forth.

The exhaust gas 126 may include thermal energy, and the thermal energy may be recovered by a heat recovery steam generation (HRSG) system 128. In combined cycle systems, such as the power production system 100, hot exhaust 126 may flow from the gas turbine 114 and pass to the HRSG system 128, where it may be used to generate high-pressure, high-temperature steam. The steam produced by the HRSG system 128 may then be passed through a steam turbine engine for further power generation. In addition, the produced steam may also be supplied to any other processes where steam may be used, such as to a gasifier used to combust the fuel to produce the untreated syngas. The gas turbine engine generation cycle is often referred to as the "topping cycle," whereas the steam turbine engine generation cycle is often referred to as the "bottoming cycle." Combining these two cycles may lead to greater efficiencies in both cycles. In particular, exhaust heat from the topping cycle may be captured and used to generate steam for use in the bottoming cycle.

In certain embodiments, the system 100 may also include a controller 130. The controller 130 may be communicatively coupled to a number of sensors 132, a human machine interface (HMI) operator interface 134, and one or more actuators 136 suitable for controlling components of the system 100. The actuators 136 may include valves, switches, positioners, pumps, and the like, suitable for controlling the various components of the system 100. The controller 130 may receive data from the sensors 132, and may be used to control the compressor 108, the combustors 110, the turbine 114, the exhaust section 118, the load 124, the HRSG system 128, and so forth.

In certain embodiments, the HMI operator interface 134 may be executable by one or more computer systems of the system 100. A plant operator may interface with the industrial system 10 via the HMI operator interface 44. Accordingly, the HMI operator interface 134 may include various input and output devices (e.g., mouse, keyboard, monitor, touch screen, or other suitable input and/or output device) such that the plant operator may provide commands (e.g., control and/or operational commands) to the controller 130.

The controller 130 may include a processor(s) 140 (e.g., a microprocessor(s)) that may execute software programs to perform the disclosed techniques. Moreover, the processor 140 may include multiple microprocessors, one or more "general-purpose" microprocessors, one or more special-purpose microprocessors, and/or one or more application specific integrated circuits (ASICS), or some combination thereof. For example, the processor 39 may include one or more reduced instruction set (RISC) processors. The controller 130 may include a memory device 142 that may store information such as control software, look up tables, configuration data, etc. The memory device 142 may include a tangible, non-transitory, machine-readable medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof).

Figure 4:
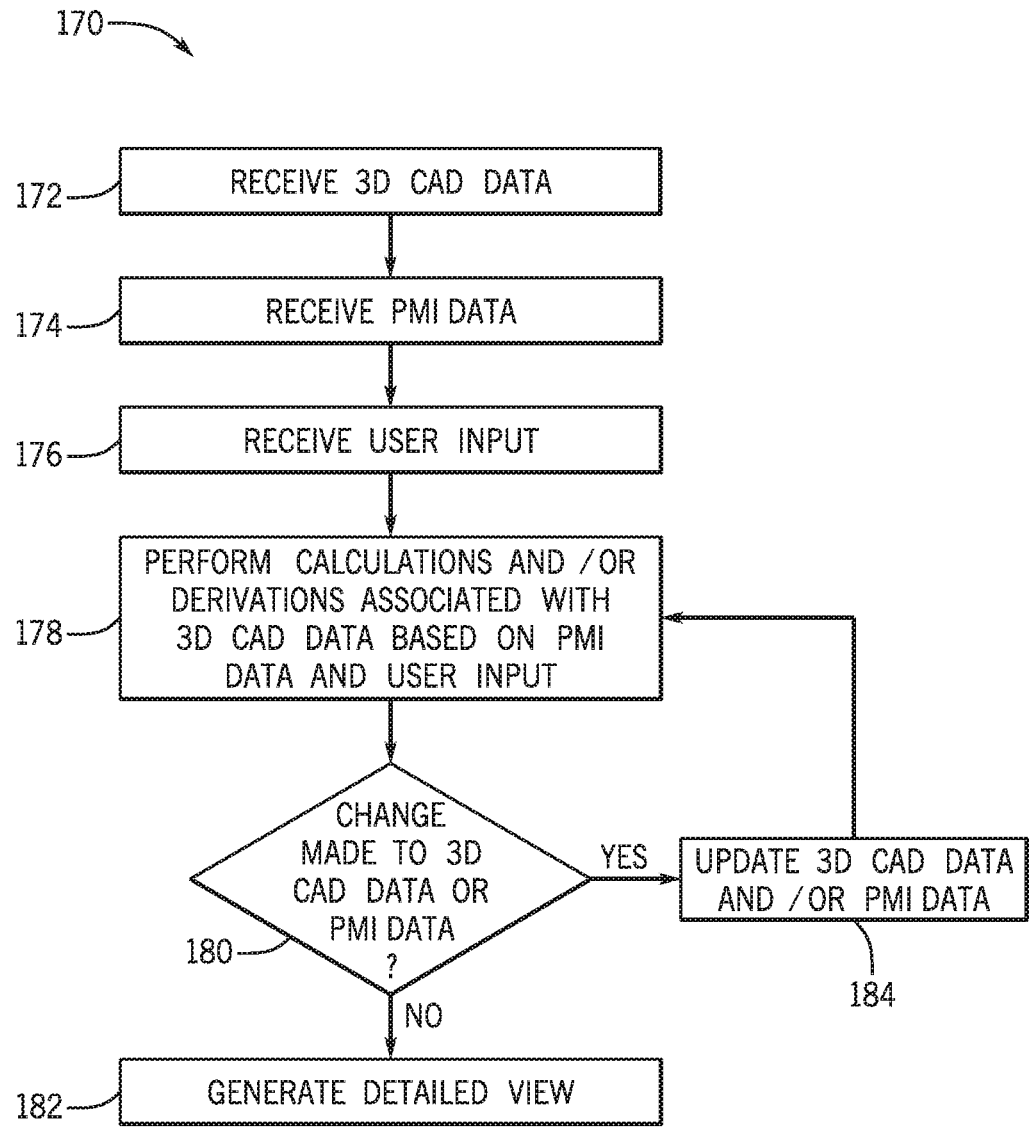
FIG. 4 is flow chart of an embodiment of a process suitable for generating a view of a computer-aided design (CAD) model.

Components of the power production system 100 may be designed and/or modeled using the CAD system 32 as part of the design processes 14. In the design of the components or during other PLM processes such as but not limited to the development/engineering processes 16 and the manufacturing processes 18, it may be beneficial to generate various views 45 of the components included in CAD models. With this in mind, FIG. 4 is a flow chart of an embodiment of a process 170 for generating views of a CAD model. The process 170 may be implemented as computer code or instructions executable via one or more of the processors 24 and stored in the memory 26. At block 172, the process 170 may receive CAD data. The CAD data may be received from various systems. For example, the CAD data may be stored on the memory 26 and/or on the cloud 70. Additionally, as discussed above, the CAD data may include data such as 2D and/or 3D models, and related model information. For example, the CAD data may reflect information regarding the measurements and dimensions of one or more models. The CAD data may additionally be created, for example, by a user via the CAD system 32.

At block 174, the process 170 may receive product and manufacturing information (PMI) data. Similar to the CAD data, the PMI data may be received from the memory 26, the cloud 70, and or created via the user, for example, through the CAD system 32. The PMI data may include information regarding various aspects of the 2D and 3D models. For example, the PMI data may reflect geometric dimensions, tolerances, text (e.g., annotations, notes), other dimensions, material type, material specifications, finishes (e.g., surface finishes), clearances, and so on, associated with the 3D models. The PMI data may be stored as data structures or objects utilized by the CAD system 32. For instance, a 2D and/or 3D model of a component of the power production system 100 and/or the gas turbine system 102 may have been designed using the CAD system 32, and the model of the component may include programming objects that are representative of and/or define various properties of the component. The programming objects may include various properties associated with the component, such as tolerances, text, and so on. Moreover, the programming objects may also provide various information related to visualization of the CAD data. For instance, the attributes may reflect a standard font, font size, a font style (e.g., underline, italics) a preferred position, a color, and the like.

At block 176, the process 170 may receive user input. In other words, the process 170 may receive data associated with an input into the CAx system 10 made by a user. For instance, the user may specify certain characteristics and/or properties of a view that a user seeks to generate. As discussed below in more detail with relation to FIG. 5 and FIG. 6, the characteristics and/or properties may include a selection of a portion of a CAD model from which the user desires to generate one or more views 45. Moreover, the user input may include other data. For example, the user may enter inputs to reflect information to be displayed in a view (e.g., geometric dimensions, tolerances, text, other dimensions, material type, material specifications, finishes, clearances, a name of the view, and the like). The text and/or name of the view may be used in uniquely identifying the view as well as in identifying any parent (or grandparent) views. For example, a view may be named "MBDXX," where "XX" may include a unique code identifying the view as well as identifying a parent view, which in turn may be used to identify a grandparent view, and so on. While the text pattern shown herein is "MBD," other text patterns may be used, such as "VIEW," "MODEL," and so on. Likewise, "XX" may include 1, 2, 3, 4, 5, of more digits or characters. The user input may also correspond to a geometric plane of the CAD model from which a view will be generated. For example, the user may select an area of the geometric plane of the CAD model from which a new view should be generated, and a new view may be generated based on such user input. The geometric plane may include a 2D plane (e.g., Euclidean 2D plane) that may be derived, for example, via three non-collinear points (e.g., x, y, z) in a 3D space, the 3D space having an X, Y, Z axis. The 3D space may include or intersect one or more components being designed, such as components of the system 100.

At block 178, the process 170 may perform calculations and/or derivations associated with the CAD data based on the PMI data and user input. More specifically, the process 170 may derive the plane or planes correlative of the view or views 45 to be generated based on the user input. The process 170 may also determine a vector that is normal, or perpendicular, to the determined plane as well as a vector that is the negative vector of the normal vector. In other words, the process 170 may determine two vectors that are perpendicular to the plane selected by the user. The process 170 may also determine four corner points of the plane (e.g., the process 170 may determine x and y coordinates for four corners of the plane). A point in the center of the plane (e.g., a fifth point) may also be generated based on the four corners. For instance, the process 170 may determine the point in the center of the plane by determining a point that is equidistant between two of the four corners that are opposite to one another.

Additionally, the process 170 may determine (block 178) a new orientation matrix for the view to be generated based on the view of the model to which the user made one or more inputs. An orientation matrix may be a mathematical matrix (e.g., a 3×3 matrix or a 3×1 matrix) that may describe the orientation of a view relative to a defined standard. For instance, the standard may be a first view (e.g., a default or original view) having a first orientation matrix (e.g., a matrix with "0" for all values), and a second orientation matrix (e.g., an orientation matrix of a new view) may reflect the orientation of the new view relative to the first view. More specifically, the process 170 may determine the new orientation matrix by modifying another orientation matrix associated with view of the model on which the user made input such that the new orientation matrix is a translation or rotation of the other orientation matrix that reflects the view to be generated. For instance, the view to be generated may be a view of the plane (or a part of the plane) viewed down the normal vector, and the new orientation matrix may be a modified version of an orientation matrix associated with the view in which the user made inputs.

Furthermore, the process 170 may determine and generate (block 178) a 3D space that is sufficient (i.e., large enough) to include each aspect of the model in the view to be generated. For instance, the process 170 may analyze the CAD data and PMI data and determine coordinates for the model and any annotations of the model. Additionally, coordinates may be stored (e.g., in the memory 26) and utilized by the process 170. In any case, based on the coordinates, the process 170 may determine a 3D space that is sufficient to encompass displaying each of the coordinates. In other words, the process 170 may determine an area of the plane associated with the view to be generated and a distance along the normal vector from which all of the determined area is viewable. For example, a face of a component may include lines, each line may include several coordinates, and the process 170 may determine and generate a 3D space that includes a display for each of the coordinates of the face of the component that are to be shown in the view to be generated.

Moreover, the process 170 may determine (block 178) a scale for the view to be generated. The scale may be based on boundaries for the view to be generated, CAD data, PMI data, and boundaries of the view of the model from which the view to be generated is derived. More specifically, coordinates of the model, the programming objects represented in the model, boundaries of a view to be generated (e.g., as indicated via user input), and boundaries of the view from which the view to be generated is derived may be used. For example, a first example view has four corner coordinates of (0, 0), (1600, 0), (0, 900), and (1600, 900), and a second view to be generated is to have corner coordinates of (200, 200), (360, 200), (200, 300), and (360, 300). The process 170 may determine a maximum and minimum for x and y coordinates of each set of corner coordinates, divide the difference of the x coordinates of the starting view by the difference of the x coordinates for the view to be generated, and divide the difference of the x coordinates of the starting view by the difference of the x coordinates for the view to be generated.

In the present example, the minimum x and y coordinate values of the view from which the view to be generated is derived are zero, and the maximum x and y coordinate values are 1600 and 900, respectively; the minimum x and y value coordinate values of the view to be generated are 200, and the maximum x and y coordinate values are 360 and 300, respectively. The differences between these values are 1600, 900, 160, and 100, respectively. The quotient of the difference of the x coordinates of the starting view divided by the difference of the x coordinates for the view to be generated is 10, and the quotient of the difference of the y coordinates of the starting view divided by the difference of the y coordinates for the view to be generated is 9. The scale of the view to be generated may be such that the x coordinates and y coordinates of the view to be generated are expanded by a number of times equal to the quotients determined above. Additionally, the coordinates of the view to be generated may be normalized. For example, the coordinates of the view to be generated may be normalized to (0, 0), (160, 0), (0, 100), and (160, 100), respectively. The x coordinates may be multiplied by a scalar of 10, and the y coordinates may be multiplied by a scalar of 9, giving coordinates of (0, 0), (1600, 0), (0, 900), and (1600, 900). In such a case, it should be noted that the earlier determined center point, which would have coordinates of (800, 450) in the present example, would also be the center point of the view to be generated once adjusted to the determined scale.

Additionally, any comments or annotations associated with a portion of the model that is to be included in the view to be generated and displayed may also be scaled in a similar manner. In other words, the comments or annotations may be scaled such that the comments and annotations may fit within the 3D space that is sufficient to include each aspect of the model in the view to be generated. Such scaling may be done in the same manner as described above.

At block 180, the process 170 may determine whether any changes have been made to the CAD data and/or PMI data. For instance, executing the received user input may result in a change to the CAD data and/or PMI data, and the process 170 may recognize the change. That is, the received user input may be indicative of a change to the CAD data and/or the PMI data. As a more specific example, a user may edit an attribute or property of an object of the PMI data, including geometric features. As another example, the user may edit dimensions of a model, resulting in changes to CAD data and PMI data. As yet another example, a user may update a feature or property of a model, such as a name of a model and displayable characteristics of a model (e.g., colors of components of the model). In any case, the process 170 may determine (decision 180) that the attribute or property was edited and also determine in what way the attribute or property was edited (i.e., determine the difference(s) between the attribute or property before and after the attribute or property was edited).

If the process 170 determines (decision 180) that no changes or edits were made to the CAD data and/or the PMI data, at block 182, the process 170 may generate a new view. The new view may be generated based on the results of the calculations and/or derivations associated with the CAD data and/or the PMI data. More specifically, the generated view may be based on the determined scale, orientation matrix, and the center point of the plane. Moreover, the view also be generated based on user input. For example, user input may have selected a portion of a model, and the process 170 may generate a view of the selected portion. Additionally, the view may include annotations and comments made by a user. Furthermore, the view may include a portion of the model displayed or aligned along a plane in three-dimensional space. That is, the view may be a 2D graphical display of a model or a portion of a model. It is to be noted that in another embodiment the view may be a 3D view, such as a rectangular portion of the CAD model.

However, if the process 170 determines (decision 180) that changes to the CAD data and/or the PMI data, the process 170 may, at block 184, update the CAD data and the PMI data. For example, the user input may reflect that the dimensions of a 3D model should be changed, which may result in changes to the CAD data and the PMI data. Once the CAD data and/or the PMI data has been updated, the process 170 may perform calculations and or derivations using the updated CAD data and/or updated PMI data in the manner described above with regard to block 178.

The view generated at block 182 may include and/or reflect various data associated with the view. For example, the view may include and/or reflect (2D) drawing data, including text, callouts, tolerances, and so on. That is, generating the view may include generating 2D data, and the view may reflect the 2D drawing data. More specifically, the 2D drawing data may be based on a perspective view of the model taken along one axis in 3D space. In other words, the 2D drawing data may be reflective of the model as the model appears in a plane as viewed from a position orthogonal to the plane.

The view generated at block 182 may also include and/or reflect annotations received as user input or requested via user input. As discussed above, the user input may include annotations; the same annotations may be included in the view. For instance, the user input may include the name of the view, and thus the name of the view may be graphically displayed within the view. Moreover, the view may be displayed within another view of the model. For instance, there may be a default view of the model, and the view generated at block 182 may be a view a portion on the model displayed within the default view, such as one or more quadrants of the default view. The generated view may be displayed in a manner to reflect how the view relates to the default view or another view (e.g., another view previously generated). For instance, if the view is a close-up of a the default view, depending on whether the user input specifies that the generated view should be a circular or rectangular portion of the default view, a circle or rectangle may be displayed within the default view, the and circle of rectangle may be labeled (i.e., include an annotation) that the name of the view as specified in the user input. As another example, the view may be a cross-section of the default view, and a line may be displayed within the default view to indicate that the generated view is a cross-section of the default view. Additionally, the user input may be reflective of a request for an annotation to be displayed. For example, the user input may include requesting that dimensions, measurements, and/or tolerances associated with the model be displayed within the view.

Figure 5:
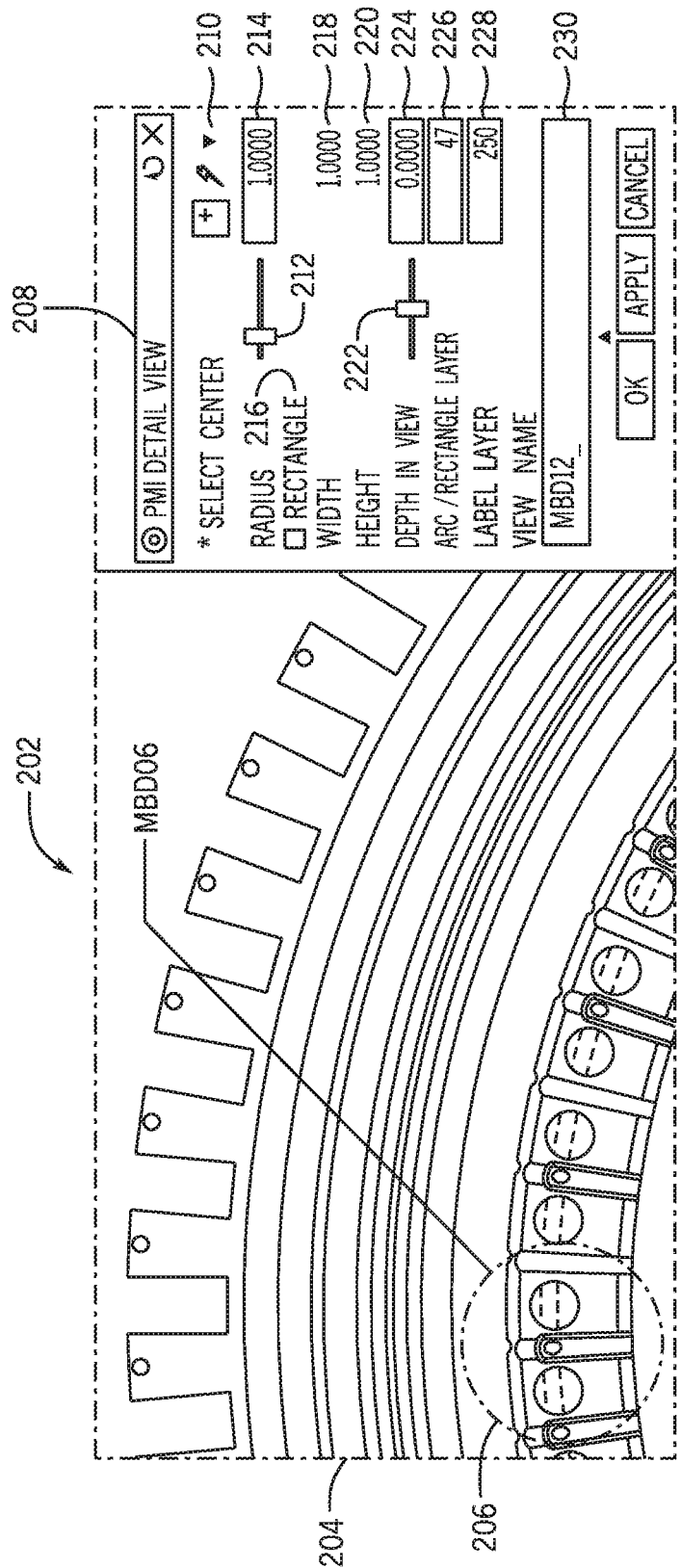
FIG. 5 is a diagram of an embodiment of a view of a model of a component of the industrial system of FIG. 3 and a detailed view tool used to generate detailed views.

The CAD system 32 may allow for several types of views to be generated. FIG. 5 is a diagram of an embodiment of a view, such as a view 202 of a CAD model 204 of a component of the power production system 100 and a detailed view tool 208 that may be used to generate detailed views. As illustrated, the view 202 includes a detailed view 206 shown in this embodiment as a circular portion of the view 202. The detailed view 206 may be displayed upon user input being entered to indicate that the user wants to derive the detailed view 206.

The detailed view tool 208 may be utilized by the user to enter user input on which a generated view is based. In the embodiment illustrated, the detailed view tool 208 is a dialog box, but in other embodiments, the detailed view tool 208 may be a window, a voice input system, a gesture input system, and so on. As illustrated, the detailed view tool 208 includes functions that the user can utilize to enter user input that may be utilized by the processors 24 to then generate a detailed view, such as the detailed view 206. The user may active a select center control 210 to select a point in the model 204 or a view that the user desires to use as a center of a view. By default, the center will be the center of a circular shaped view that will be generated. The user may then adjust the radius of the circle of the view to be generated using either a radius slider control 212 or a radius length box control 214. Either or both of the radius slider control 212 and the radius length box control 214 may be utilized. For instance, the user may drag the radius slider control 212 to reduce or increase the radius. It should be noted that when the radius slider control 212 is "slid" or moved all the way to one direction (i.e., to one end of the bar on which the slider is positioned), the radius slider control 212 may automatically be moved to a middle position after the first move so that the user may continue to reduce or increase the radius in subsequent moves. As the radius slider control 212 is slid, the radius length box control 214 control may display the radius of the view to be generated. Additionally, the user may enter a radius length value into the radius length box control 214 in addition, or as an alternative, to utilizing the radius slider control 212.

In the alternative to generating a circular view, the user may select the checkbox control 216 to generate a rectangular view. In the present embodiment, upon selecting to generate a rectangular view, the user may not use the radius slider control 212 or radius length box control 214 to adjust the size of the view. Instead, the user may enter values of the width and height of the view in a width box control 218 and a height box control 220, respectively. In other embodiments, the width and height of the rectangular view to be generated may be altered using sliders that may be utilized in the same manner as the radius slider control 212.

Additionally, the user may use a depth in view slider control 222 and an input box control 224 to select a depth that the view to be generated will have relative to the view from which the view to be generated is derived. Similar to the radius slider control 212, when the depth in view slider control 222 is slid all the way to one direction (i.e., to one end of the bar on which the slider is positioned), the depth in view slider control 222 may automatically be moved to a middle position so that the user may continue to reduce or increase the depth. As the depth in view slider control 222 is slid, the input box control 224 displays the depth of the view to be generated. Additionally, the user may enter a depth value into the input box control 224 in addition, or as an alternative, to utilizing the radius slider depth in view slider control 222.

Furthermore, the user may utilize an arc/rectangle layer box control 226 to enter a value for the layer of the selected area. That is, the user may select a value related to the level of visibility the selected area may have in the view from which the view to be generated is derived. For instance, the view to be generated, or a view that is already generated, may be indicated with dashed lines (e.g., the view 206), and the user may change the level of visibility (e.g., make the lines visible or not visible) of the dashed lines. Additionally, the user, via an input box control 228, may enter a value for a layer that the view to be generated will be defined as having. That is, the user may use the input box control 228 to input a value that is defined as the layer set using the arc/rectangle layer box control 226.

Moreover, the detailed view tool 208 may include an input box control 230 in which the user may specify the name of the view to be generated. By default, the view to be generated will be named with the lowest integer value not already used in a view name followed by an underscore. For instance, as illustrated, the input box control 230 displays the name "MBD12_" —which denotes that MBD01-MBD11 are views that have already been generated. However, the user may edit the name such as by deleting the default name and adding a different name or by adding to the default name (e.g., "MBD12_component_zoom"). Additionally, the names may be indicative of a relationship between two or more views. For instance, the names of the views may indicate a parent-child relationship between two views.

Figure 6:
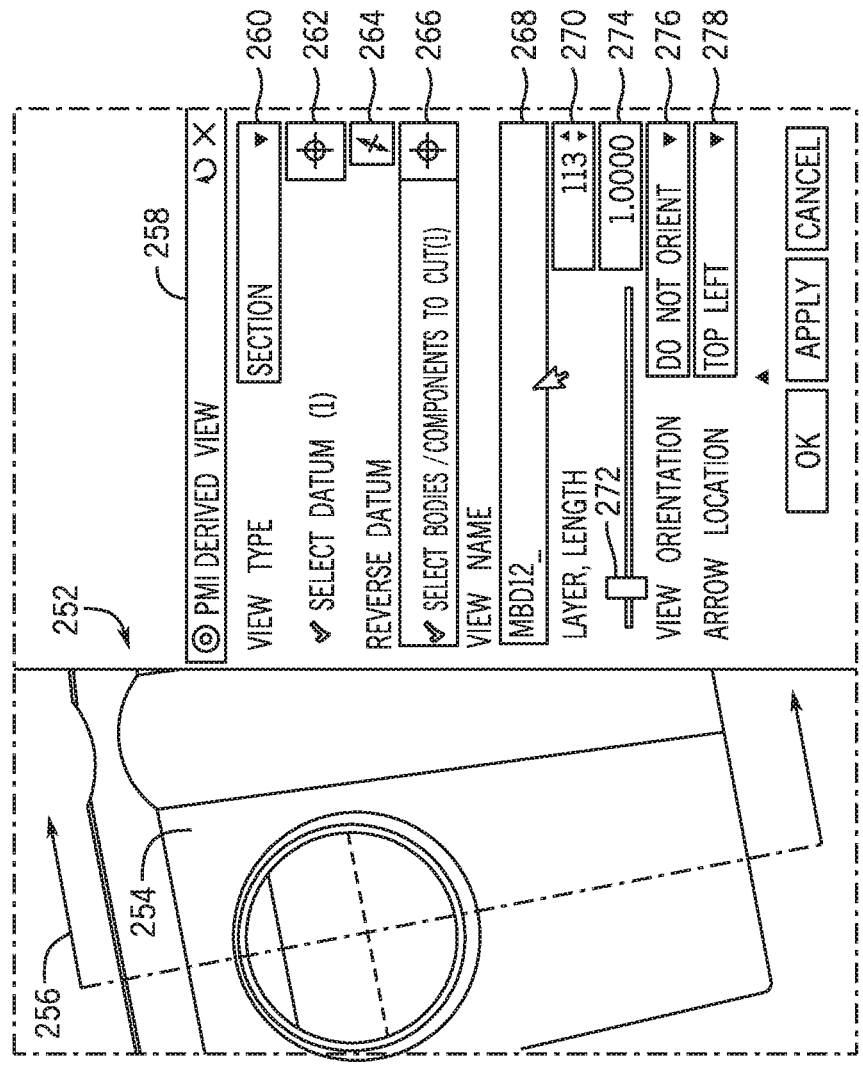
FIG. 6 is a diagram an embodiment of a view of a model of a component of the industrial system of FIG. 3 and a derived view tool used to generate detailed views.

Another type of view that may be generated is a derived view. FIG. 6 is a diagram of an embodiment of a view 252 of a CAD model 254 of a component of the power generation system 100 and a derived view tool 258. As illustrated, the view 252 is a view of the model 254 that shows an exterior portion of the component. However, in other embodiments, the view 252 may show a cross-section of a component, a perspective view, a top view, and so on. As illustrated, the view 252 also includes a derived view 256 of the model 254 that may have been named (e.g., "MBD08"). The derived view 256 was generated via the techniques described herein, and its relationship to the view 252 is illustrated within the view 252. More specifically, the derived view 256 is a cross-sectional view of a portion of the CAD model 254 shown in the view 252. Similar to the detailed view 206, the derived view 256 may be viewed upon receiving user input indicating that a user wishes to view the model 254 from the derived view 256.

The user may use the derived view tool 258 as well functions executed via controls of the derived view tool 258 to create and display a derived view. The user may select the type of view to generate using a drop-down list control 260. The user may select various types of views to be generated, such a cross-sectional view, perspective view, and view based on a specific orientation (e.g., top-down view).

The user may use a datum select tool control 262 to select a datum from which the view is to be generated. In other words, the user may select a datum, and a view will be derived based on the selected datum. In the context of the datum select tool control 262, a datum may be plane (e.g., a face of a component depicted in the model). In other words, the user may select a plane, and a view may be derived based on the selected plane.

The user may use a reverse datum tool control 264 to change the direction from which the selected datum will be viewed in the view to be generated. In other words, when a user uses the reverse datum tool control 264, the view to be generated may be from a different perspective (e.g., a view along a different axis). Additionally, when a cross-sectional view is to be generated, a tool control 266 may be used to select the bodies and/or components through which a cross-section will be taken to generate the cross-sectional view.

Similar to the detailed view tool 208, the derived view tool 258 also includes an input box control 268 that may display the name of the view to be generated. A default name may be generated in the same manner as discussed above.

Moreover, a user may edit the default name of a view to be generated in the same way described above with relation to the detailed view tool 208.

Additionally, the user may utilize an input box control 270 to choose a layer for the selected datum as well as arrows that are associated with the selected datum. Based on the selected layer, the user may adjust the visibility of the selected datum and/or the arrows associated with the selected datum. For example, the user may enter a value, and such a value may allow for the selected datum and/or the arrows associated with the selected datum to be invisible in the view to be generated.

Moreover, the user may use a slider control 272 and an arrow size box control 274 to adjust the size of the arrows associated with the selected datum. Either or both of the slider control 272 and the arrow size box control 274 may be utilized. For instance, the user may drag the slider control 272 to reduce or increase the size of the arrows. It should be noted that when the slider control 272 is moved all the way to one direction (i.e., to one end of the bar on which the slider is positioned), the slider control 272 may automatically be moved to a middle position so that the user may continue to reduce or increase the size of the arrows. As the slider control 272 is slid, the arrow size box displays the size (e.g., length) of the arrows. Additionally, the user may enter an arrow size value into the arrow size box control 274 in addition, or as an alternative, to utilizing the slider control 272.

The user may also select an orientation of a view to be generated using a drop-down box control 276. For instance, the user may select for the view to not have an orientation. The user may also select for the view to be generated to have an orientation that is relative to the selected datum (e.g., parallel or normal to the selection datum). Moreover, an orientation relative to a different plane may also be selected. Furthermore, the orientation of the view to be generated may also be relative to an axis or axes that may be displayed with the model. For instance, a view may be oriented such that is parallel or perpendicular to a specific axis (e.g., x, y, or z axis).

Arrow location drop-down box control 278 may be utilized by a user to select where arrows associated with the datum will be displayed. For example, as illustrated in FIG. 6, the arrow location drop-down box control 278 displays "top left," meaning that arrows associated with the selected datum will be displayed to above and to the left of the selected datum. The arrow location drop-down box control 278 also includes several other options as to where the arrows will be displayed with relation to the selected datum (e.g., front, back, top, top right, left, center, right, bottom left, bottom, and bottom right).

Technical effects of the subject matter disclosed herein include, but are not limited to, generating views of CAD models, such as CAD models of components of a power generation system 100. In particular, the process 170 may generate the views based on user input and data associated with the model and the component (i.e., CAD model data and PMI data). The process 170 may perform various calculations and derivations in order to generate the new views. In this manner, views may be generated, and the views may be utilized in order to design, review, and ultimately build the part(s) included in the model.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A method, comprising:
    receiving, by a processor, a three-dimensional (3D) computer-aided design (CAD) data associated with a 3D CAD model;
    receiving, by the processor, a product and manufacturing information (PMI) data associated with the 3D CAD data;
    causing, by the processor, a view tool to be displayed, wherein the view tool comprises:
        a first tool with which a user selection of a two-dimensional plane can be made; and
        a second tool with which a type of view can be selected;
    receiving, by the processor, a user input comprising:
        PMI data not already associated with the 3D CAD data;
        a selection, made via the first tool of the view tool of the two-dimensional plane within a first view of the 3D CAD data; and
        a selection, made via the second tool of the view tool, of a type of view of a second view of the 3D CAD data to be generated from the first view of the 3D CAD data, wherein the type of view is a cross-sectional view;
        a selection, made via a third tool of the view tool, of one or more components represented by the 3D CAD model through which a cross-section will be taken to generate the second view; and
        a selection, made via a fourth tool of the view tool, of a length of arrows of a visual indication of the second view of the 3D CAD data to be displayed within the first view, wherein the arrow are indicative of the cross-section; and
    generating, by the processor, the second view of the 3D CAD data based on the received user input comprising the PMI data not already associated with the 3D CAD data; and
    causing, by the processor, the visual indication of the second view, wherein the visual indication indicates a portion of the 3D CAD model included in the second view.

2. The method of claim 1, wherein the second view comprises a first two-dimensional display of the 3D CAD data, a second two-dimensional display of the PMI data, or a combination thereof.

3. The method of claim 1, wherein the user input comprises one or more annotations, and the second view displays one or more graphical representations of the one or more annotations.

4. The method of claim 1, comprising determining, by the processor, whether the user input is indicative of a change is made to the 3D CAD data or the PMI data.

5. The method of claim 4, comprising updating, by the processor, the 3D CAD data or the PMI data when user input is determined to be indicative of a change.

6. The method of claim 5, comprising performing, by the processor, derivations associated with the updated CAD data or the updated PMI data based on the updated PMI data or the user input to generate the view of the 3D CAD data.

7. The method of claim 1, wherein generating, by the processor, the second view of the 3D CAD data comprises determining a first orientation matrix of the second view.

8. The method of claim 7, wherein the first orientation matrix is a modified version of a second orientation matrix associated with the first view of the 3D CAD data.

9. The method of claim 1, comprising displaying, within the first view, a visual indication of:
    a name of the second view; and
    a portion of the 3D CAD model included in the second view.

10. A computer aided technologies (CAx) system, comprising:
    a processor configured to:
        receive a three-dimensional (3D) computer-aided design (CAD) data associated with a 3D CAD model;
        receive a product and manufacturing information (PMI) data associated with the 3D CAD data;
        cause a view tool to be displayed, wherein the view tool comprises:
            a first tool with which a user selection of a two-dimensional plane can be made; and
            a second tool with which a type of view can be selected;
        receive a user input comprising:
            PMI data not already associated with the 3D CAD data;
            a selection, made via the first tool of the view tool, of the two-dimensional plane within a first view of the 3D CAD data; a selection, made via the second tool of the view tool, of the type of view of a second view of the 3D CAD data to be generated from the first view of the 3D CAD data, wherein the type of view is a cross-sectional view;
            a selection, made via a third tool of the view tool, of one or more components represented by the 3D CAD model through which a cross-section will be taken to generate the second view; and
            a selection, made via a fourth tool of the view tool, of a length of arrows of a visual indication of the second view of the 3D CAD data to be displayed within the first view, wherein the arrow are indicative of the cross-section;
        generate the second view of the 3D CAD data based on the received user input comprising the PMI data not already associated with the 3D CAD data; and
        cause the visual indication of the second view, wherein the visual indication indicates a portion of the 3D CAD model included in the second view.

11. The CAx system of claim 10, wherein the processor is configured to determine a scale of the second view, wherein the scale is relative to the first view.

12. The CAx system of claim 10, wherein the second view is generated based on a determination of four points on the two-dimensional plane and a first calculation of a fifth point that is equidistant from two of the four points.

13. The CAx system of claim 10, wherein:
the user input comprises a selection of where the arrows will be displayed in the first view relative to the two-dimensional plane; and
the selection of where the arrows will be displayed in the first view relative to the two-dimensional plane is made using a fifth tool of the view tool.

14. The CAx system of claim 10, wherein:
the user input comprises a selection of an orientation for the second view, wherein the orientation is parallel or perpendicular to a second two-dimensional plane that is different than the two-dimensional plane; and
the selection of the orientation for the second view is made using a fifth tool of the view tool.

15. The CAx system of claim 10, wherein the view tool comprises a fifth tool with which a name for the second view can be entered, wherein the name is indicative of a parent-child relationship between the first view and the second view.

16. The CAx system of claim 10, wherein the user input comprises:
a selection, made via a fifth tool of the view tool, of a level of visibility of the visual indication of the second view; or
a selection, made via a sixth tool of the view tool, of a level of visibility of the visual indication of the second view.

17. A tangible, non-transitory, computer-readable medium comprising instructions that, when executed, are configured to cause a processor to:
receive a three-dimensional (3D) computer-aided design (CAD) data associated with a 3D CAD model;
receive a product and manufacturing information (PMI) data associated with the 3D CAD data;
cause a view tool to be displayed, wherein the view tool comprises:
a first tool with which a user selection of a two-dimensional plane can be made; and
a second tool with which a type of view can be selected;
receive a user input comprising:
PMI data not already associated with the 3D CAD data;
a selection, made via the first tool of the view tool, of the two-dimensional plane within a first view of the 3D CAD data; and
a selection, made via the second tool of the view tool, of a type of view of a second view of the 3D CAD data to be generated from the first view of the 3D CAD data;
a selection, made via a third tool of the view tool, of one or more components represented by the 3D CAD model through which a cross-section will be taken to generate the second view; and
a selection, made via a fourth tool of the view tool, of a length of arrows of a visual indication of the second view of the 3D CAD data to be displayed within the first view, wherein the arrow are indicative of the cross-section;
generate the second view of the 3D CAD data based on the received user input comprising the PMI data not already associated with the 3D CAD data; and
cause display, within the first view, of the visual indication of the second view of the 3D CAD data, wherein the visual indication indicates a portion of the 3D CAD model included in the second view.

18. The tangible, non-transitory, computer-readable medium of claim 17, wherein the instructions are configured to cause the processor to determine a space that is large enough to include the portion of the 3D CAD model included in the second view.

19. The tangible, non-transitory, computer-readable medium of claim 17, wherein the user input comprises a selection, made via a fifth tool of the view tool, of a level of visibility of the visual indication of the second view.

20. The tangible, non-transitory, computer-readable medium of claim 17, wherein the user input comprises a selection, made via a fifth tool of the view tool, of an orientation of the second view relative to the two-dimensional plane.

* * * * *